United States Patent [19]

Tamura et al.

[11] Patent Number: 4,893,695

[45] Date of Patent: Jan. 16, 1990

[54] SPEAKER SYSTEM

[75] Inventors: Tadashi Tamura, Kadoma; Shuji Saiki, Hirakata; Kazue Sato, Neyagawa, all of Japan

[73] Assignee: Matsushita Electric Industrial Co., Ltd., Osaka, Japan

[21] Appl. No.: 206,377

[22] Filed: Jun. 14, 1988

[30] Foreign Application Priority Data

| | | | |
|---|---|---|---|
| Jun. 16, 1987 | [JP] | Japan | 62-149646 |
| Nov. 20, 1987 | [JP] | Japan | 62-294419 |
| Apr. 28, 1988 | [JP] | Japan | 63-106355 |
| May 2, 1988 | [JP] | Japan | 63-109343 |

[51] Int. Cl.[4] .......... H05K 5/00

[52] U.S. Cl. .......... 181/151; 181/146; 181/152; 181/153; 181/159; 181/180; 181/184; 181/187; 181/196; 181/199; 381/156; 381/158

[58] Field of Search .......... 181/151, 152, 159, 180, 181/184, 185, 189, 190, 196, 198, 146, 199, 153; 381/156, 158

[56] References Cited

U.S. PATENT DOCUMENTS

| | | | |
|---|---|---|---|
| 3,876,035 | 4/1975 | Eckel | 181/198 |
| 3,982,607 | 9/1976 | Evans | 181/152 |
| 4,027,117 | 5/1977 | Nakamura | 381/158 |
| 4,369,857 | 1/1983 | Frazer et al. | 181/159 |
| 4,381,831 | 5/1983 | Putnam | 181/152 |

FOREIGN PATENT DOCUMENTS

| | | |
|---|---|---|
| 0037139 | 10/1981 | European Pat. Off. . |
| 0129320 | 12/1984 | European Pat. Off. . |
| 49-134312 | 12/1974 | Japan . |

*Primary Examiner*—B. R. Fuller

*Attorney, Agent, or Firm*—Stevens, Davis, Miller & Mosher

[57] ABSTRACT

A speaker system which has a speaker unit with a diaphragm and an acoustic path provided on the front side of the diaphragm so as to guide sound waves emitted from the diaphragm. The acoustic path is defined by a sound absorbing member. The space in the acoustic path and the sound absorbing member is separated by a partition member which is disposed in such a manner that at least a portion of the sound absorbing member is exposed to the space in the acoustic path, except that the portion of the sound absorbing member just adjacent the diaphragm is not exposed to the acoustic path. This arrangement eliminates peaks and troughs of resonance determined by the length of the acoustic path, so that flat sound pressure frequency characteristics can be obtained over a wide range up to high-pitch tone region.

13 Claims, 7 Drawing Sheets

SPEAKER SYSTEM

BACKGROUND OF THE INVENTION

1. Field of the Invention

The present invention relates to a speaker system having a horn or an acoustic pipe provided in front of the speaker diaphragm and adapted for guiding sonic waves therefrom.

2. Description of the Prior Art

A speaker system is known in which a sound wave generated by a diaphragm is introduced to the second outlet opening of the speaker through a horn or an acoustic pipe provided on the front side of the diaphragm. This type of speaker systems is finding increasingly wide use because it provides a higher level of the output sound pressure and superior directivity as compared with ordinary speaker systems which do not have such a horn or acoustic pipe.

A description will be given hereinunder, with reference to the drawings, as to a known speaker system of the type having a horn or an acoustic pipe.

Referring to FIG. 9 which is a sectional view of a known speaker system of the type mentioned above, a back cavity 2 is provided on the rear side of a speaker unit 1 for the purpose of preventing radiation of reflected sound from the speaker diaphragm. A horn 9 is provided in front of the speaker diaphragm and extends towards the sound outlet opening of the speaker system. The cross-sectional area of the horn 9 is progressively increased from the end adjacent to the speaker diaphragm towards the end adjacent to the sound outlet opening of the speaker system. The horn 9 thus constitutes an acoustic path which introduces the sound wave output from the speaker. The change in the acoustic impedance at the sound outlet opening of the speaker system is made extremely small provided that the horn 9 has a length which is sufficiently greater than the length of the wavelengths of sound wave of the reproduction band. In such a case, a very good matching is obtained at the sound outlet opening of the speaker system so that a flat reproduction sound pressure frequency characteristic is obtained thus realizing an ideal speaker system. Actually, however, in case of incorporation of the speaker system in an acoustic apparatus in sever, it is not practically possible to design horn 9 having a length so large that it is sufficiently greater than the wavelengths of sound waves in the reproduction band. Therefore, the speaker system employing such horns usually exhibit reproduction sound pressure frequency characteristics which contain many peaks and troughs as shown in FIGS. 2 (graph B) and 8 (graph B).

This is attributable to the fact that reflection waves are generated at the sound outlet opening of the speaker due to a drastic change in the acoustic impedance. In consequence, resonances are caused in the acoustic path. The same problem is encountered also with a speaker system which makes use of an acoustic pipe in place of the horn 9. Thus, the speaker systems which employ acoustic pipes as the acoustic paths exhibit reproduction sound pressure frequency characteristics which contain many peaks and troughs. This is attributed to the fact that, as shown in FIG. 10, a resonance takes place at a frequency f which is represented by the following formula:

$$f=(2n-1)C/4L(n=1, 2, 3, \ldots,)$$

where, L represents the length of the acoustic pipe, while C represents the velocity of the sonic wave.

FIG. 10 illustrates the sound pressure distribution and velocity distribution as obtained when the number n is 2 (n=2).

SUMMARY OF THE INVENTION

Accordingly, an object of the present invention is to provide a speaker system which provides a flat sound pressure frequency characteristics free from resonance peaks and troughs without requiring the length of the horn or the acoustic pipe to be increased.

To this end, according to the present invention, there is provided a speaker system comprising: an acoustic path provided on the front side of a speaker diaphragm and adapted for introducing a sound wave, the acoustic path being defined by a sound absorbing member; and a partition member which is disposed in the acoustic path in such a manner that at least a portion of the sound absorbing material is exposed to the interior of the acoustic path, except a part just before the diaphragm.

With this arrangement, the sound wave components reflected due to a drastic change in the acoustic impedance at the sound outlet opening are effectively absorbed by the sound absorbing member constituting the sound path, thereby providing flat sound pressure frequency characteristics with reduced peaks and troughs.

In addition, the components of the sound wave other than those which cause the peaks and troughs are introduced along the surface of the partition member to the sound outlet opening of the speaker system, without being absorbed by the sound absorbing member, whereby the reproduction band can be broadened.

Japanese Patent Unexamined Publication No. 49-134312 discloses a speaker system in which a horn for guiding the sound wave from a diaphragm is made from a material which exhibits a small tendency of generation of reflected waves (noise), i.e., a material which absorbs the noise well. This, however, is irrelevant to the invention of this application which is intended for absorbing reflected waves attributable to a drastic change in the acoustic impedance at the sound outlet opening of the speaker system.

DESCRIPTION OF THE PREFERRED EMBODIMENTS

Preferred embodiments of the present invention will be described hereinunder with reference to the accompanying drawings.

Figure 1:
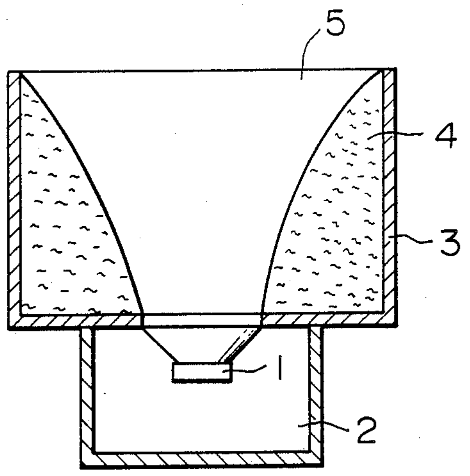
FIG. 1 is a sectional view of a first embodiment of a speaker system in accordance with the present invention.
Figure 4:
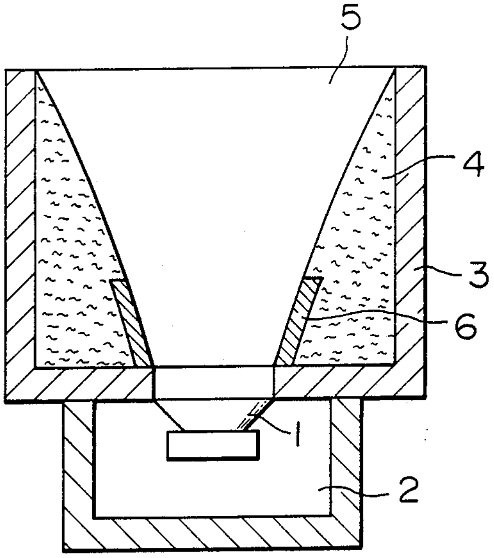
FIG. 4 is a sectional view of a second embodiment of the speaker system in accordance with the present invention.

FIG. 1 shows a first embodiment of the speaker system of the present invention and FIG. 4 shows a second embodiment which includes a speaker unit 1, a back cavity 2 on the rear side thereof, an acoustic pipe 3 for guiding and introducing sound waves generated on the front side of the diaphragm of the speaker unit 1 and a partition plate 6 disposed in the acoustic pipe 3 and defining, in part, an acoustic path 5 and a sound absorbing member 4 changed in the space between partition plate 6 and acoustic pipe 3 so as to define therein the acoustic path in cooperation with partition plate 6.

The operation of the above-described speaker system is explained below. The sound emitted from the rear side of the speaker unit 1 is confined in the back cavity 2 so that it is not transmitted to the outside of the speaker system. On the other hand, the sound emitted from the front side of the diaphragm is introduced through the acoustic pipe 3 to the sound outlet opening of the speaker system so as to be radiated therefrom. However, a part of the sound wave introduced to the sound outlet opening is reflected due to a drastic change in the acoustic impedance add at the opening, tending to propagate backward to the diaphragm surface. According to the invention, the reflected sound wave is conveniently absorbed by the sound absorbing material 4 disposed in the acoustic pipe 3, thus eliminating the existance of a standing wave in the acoustic pipe.

As will be seen from FIG. 1, the shorter the distance to the front surface of the diaphragm, the greater the thickness of sound-absorbing member 4 becomes at its portion closest to the diaphragm, and accordingly, the impedance of sound-absorbing member 4 as viewed from the reflected sound wave varies continuously from the diaphragm to the sound outlet opening, whereby the reflected sound wave entering from the sound outlet opening into acoustic path 5 is effectively absorbed by sound absorbing member 4 without any unnecessary reflection.

Namely, the amount of material of the sound absorbing member 4 increases towards the front side of the diaphragm so that the impedance exhibited by the sound absorbing member 4 to the reflected sound wave changes linearly, whereby the reflected sound wave from the sound outlet opening is effectively absorbed by the sound absorbing member without any unnecessary reflection.

The linear and progressive change in the impedance provided by the sound absorbing member may be controlled in various ways. For instance, it is possible to control the manner of change in the impedance by suitably varying the amount of the material of the sound absorbing member 4 along the length thereof, or by changing the material or density of the sound absorbing member 4 so as to adjust the flow resistance per unit area.

Further, partition plate 6 constitutes a wall extending from the diaphragm up to a height which is one-third of the height of acoustic pipe 3 so as to lead the sound wave to the opening end without hindering the high frequency band sound waves liable to be absorbed. It is noted that the velocity of particles of the sound transmitting medium increases in the range above the height of one-third of the acoustic pipe 3 which is measured from the diaphragm, to the opening end. Therefore, it is possible to suppress a sound pressure peak at a frequency at which a standing wave is produced. Further, sound waves at the other frequencies can be led to the opening without being hindered by the sound absorbing material 4 by forming the sound absorbing member 4 in a horn shape.

Needless to say, the sound wave produced by the diaphragm can be introduced to the sound outlet opening thrugh the acoustic path defined by the sound absorbing member 4 without being impeded by the sound absorbing member 4.

Figure 2:
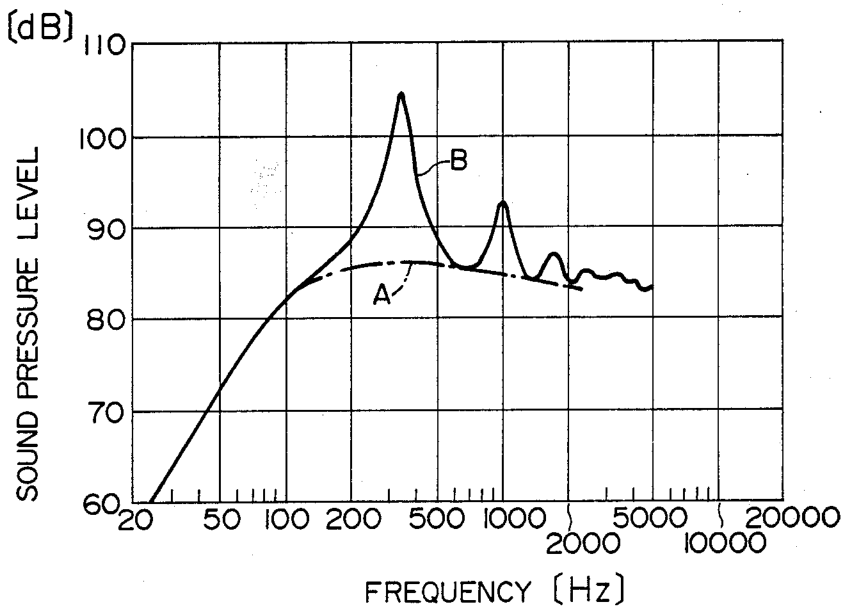
FIG. 2 depicts a graph A illustrating the sound pressure frequency characteristics of a first embodiment and the sound pressure frequency characteristics of a known speaker system of the invention and a graph B which illustrates the sound pressure frequency characteristics of a known speaker system.

FIG. 2 illustrates the reproduction sound pressure frequency characteristics exhibited by a speaker system with the horn or acoustic pipe in accordance with the first embodiment, in comparison with the characteristics exhibited by the conventional arrangement. From this Figure, it will be understood that the conventional speaker system exhibits characteristics B which includes peaks and troughs due to existence of a standing wave, while the speaker system of the first embodiment exhibits flat reproduction sound pressure frequency characteristics A up to a high frequency sound region of the tone.

Figure 3A:
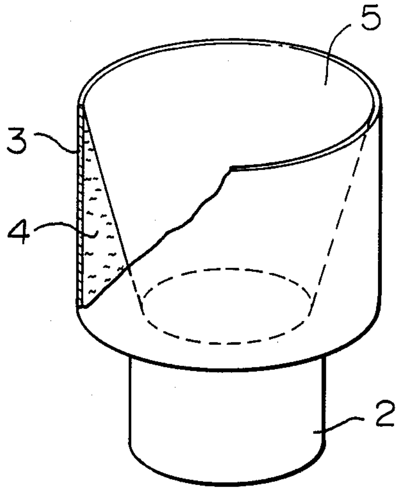
FIGS. 3(*a*) to 3(*c*) are perspective views of different examples of the first embodiment.
Figure 3B:
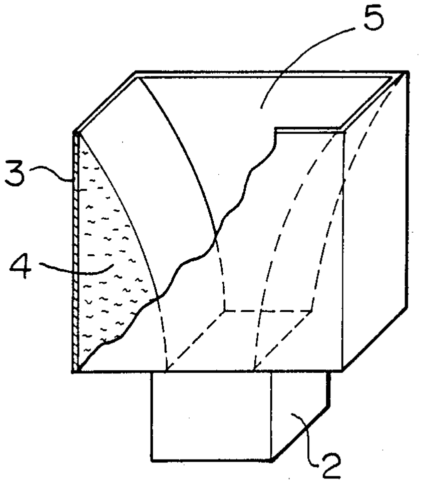
Figure 3C:
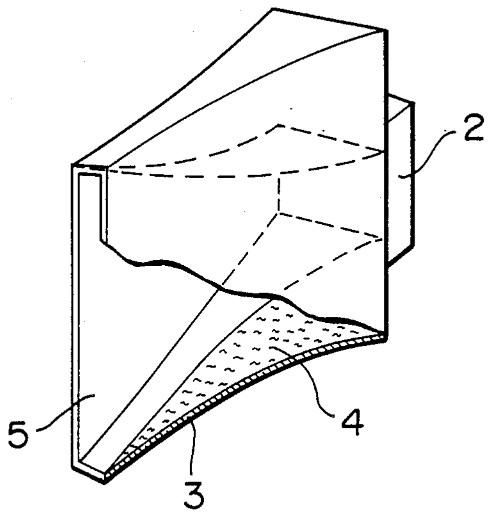

In the first embodiment as described above, the cross-sectional area of the acoustic path is increased from the end adjacent to the surface of the diaphragm towards the sound outlet opening. Such an acoustic path 5 may be defined partition plate 6 and sound absorbing member 4 in a cylindrical acoustic pipe 3 as shown in FIG. 3(*a*) or, alternatively, in a rectangular parallelopiped acoustic pipe 3, as shown in FIG. 3(*b*). The same advantages can be obtained in either the FIG. 3(*a*) or the FIG. 3(*b*) arrangement.

The advantages brought about by this embodiment can be enjoyed also when the acoustic path 5 has a tubular form of a constant cross-sectional area. The same advantages are derived also from an arrangement of FIG. 3(*c*) in which the sound absorbing member 4 has a horn-like form, while the acoustic pipe 3 is constructed to decrease its cross-sectional area towards the sound outlet opening, thus providing a constant cross-sectional area of the acoustic path 5, as shown in FIG. 3(*c*).

Figure 5:
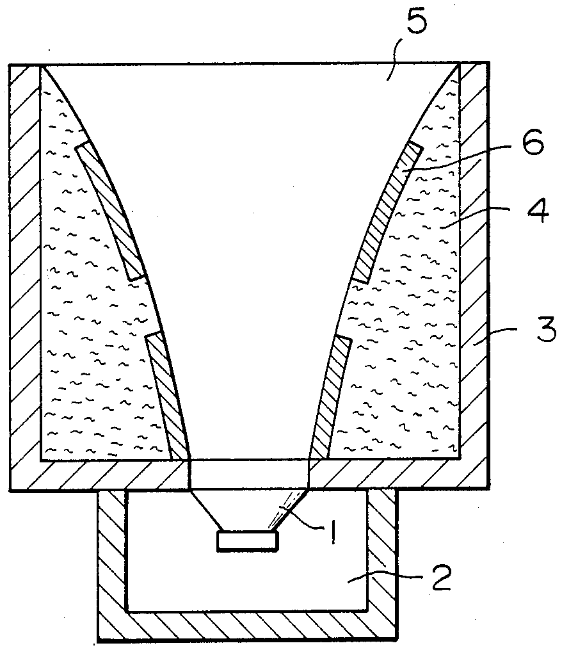
FIG. 5 is a sectional view of a third embodiment of the speaker system in accordance with the present invention.

FIG. 5 shows a third embodiment of the speaker system of the present invention. The third embodiment has a speaker unit 1, a back cavity 2, an acoustic pipe 3 for guiding sound wave generated on the front side of the diaphragm in the speaker unit 1, a partition member 6 disposed in the acoustic pipe 3 so as to define an acoustic path 5 and having slits one of which is located near the sound outlet opening of the acoustic pipe 3 while the other is in the region which is about ⅓ of the full length of the acoustic pipe 3 as measured from the surface of the speaker diaphragm, and a sound absorbing material received in the space between the acoustic pipe 3 and the partition member 6.

The operation of the speaker system in accordance with the third embodiment is as follows. The sound wave emitted from the rear side of the speaker unit 1 is confined in the back cavity 2 so that it does not radiate outside. On the other hand, the sound from the front side of the diaphragm in the speaker unit 1 is guided by the acoustic pipe 3 to reach the sound outlet opening so as to be radiated therefrom. A portion of the sound wave reaching the sound outlet opening, however, is reflected because the acoustic impedance is drastically changed at the sound outlet opening. The reflected wave tends to propagate backward towards the surface of the diaphragm. The reflected wave, however, is effectively absorbed by the sound absorbing member 4 in the acoustic pipe 3 so that no standing wave is generated in the acoustic pipe.

As explained before, the partition member 6 has slits in the region near the sound outlet opening and in the region which is ⅓ of the full length of the acoustic pipe 3 as measured from the surface of the speaker diaphragm, i.e., in the regions where the particle velocity is high. It is therefore possible to selectively absorb the sound wave components of frequency regions having peaks of sound pressure. Other components of the sound wave can be guided to the sound outlet opening without being impeded by the sound absorbing member 4.

Thus, the third embodiment also provides flat sound pressure frequency characteristics, by suppressing the peaks of sound pressure which are inevitably high in the known horn or acoustic pipe due to the presence of a standing wave.

Obviously, the same advantages are brought about when the acoustic path 5 of the third embodiment is modified as shown in FIGS. 3(*a*) to 3(*c*).

Figure 6A:
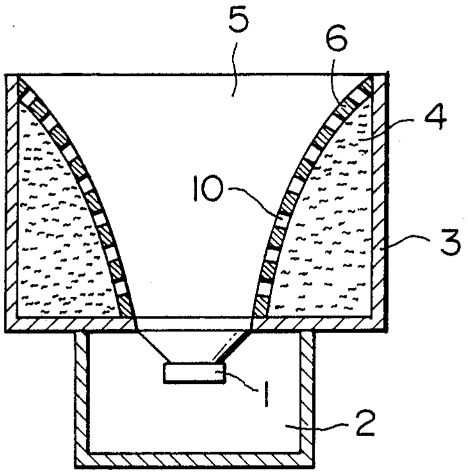
FIGS. 6(*a*) and 6(*b*) are a sectional view and a front elevational view of an essential part of a fourth embodiment of the speaker system of the present invention.
Figure 6B:
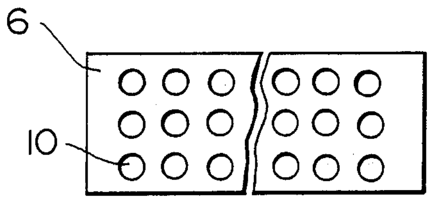

FIGS. 6(*a*) and 6(*b*) show a fourth embodiment of the speaker system in accordance with the present invention. As will be seen from FIG. 6(*a*), the fourth embodiment has a speaker unit 1, a back cavity 2, an acoustic pipe 3 which guides the sound wave generated on the front side of the diaphragm of the speaker unit 1, a partition member 6 disposed in the acoustic pipe 3 so as to define an acoustic path 5 and having a plurality of apertures, and a sound absorbing member 4 filling the space between the wall of the acoustic pipe 3 and the partition member 6.

As will be seen from FIG. 6(*b*), the apertures 10 formed in the partition member 6 have a diameter of 8 mm and are arranged at a pitch of 30 mm.

The operation of the fourth embodiment of the speaker system will be described hereinunder. The sound emitted from the rear side of the diaphragm of the speaker unit 1 is confined in the back cavity 2 so that it does not radiate to the outside. On the other hand, the sound wave emitted from the front side of the diaphragm is guided to the sound outlet opening through the acoustic pipe 3 so as to be radiated therefrom. A portion of the sound wave reaching the sound outlet opening of the acoustic pipe 3, however, is reflected to propagate backward so as to reach the front surface of the diaphragm, because a drastic change in the acoustic impedance takes place at the sound outlet opening. The reflected sound wave, however, is absorbed by the sound absorbing member 4 which continuously extends over the entire area of the inner surface of the acoustic pipe 3 so that establishment of standing wave in the acoustic pipe 3 is prevented.

In this embodiment, the partition member 6 has apertures 10 of 8 mm diameter arranged at a pitch of 30 mm. The reflected sound wave causes a resonation with the air in the apertures so that a large sound absorption rate is obtained in the region near 1 KHz, thus enabling absorption of the second peak of the sound pressure in the acoustic pipe 3 which has a length of 40 cm. Other peaks are directly absorbed by the sound absorbing member 4 rather than be resonance with the air in the apertures. The diameter and the pitch of the apertures 10 can be varied as desired to enable absorption of a peak at an arbitrary resonant frequency. Obviously, the configuration of the acoustic path 5 may be varied as illustrated in FIGS. 3(*a*) to 3(*c*), without imparing the advantages.

Figure 7:
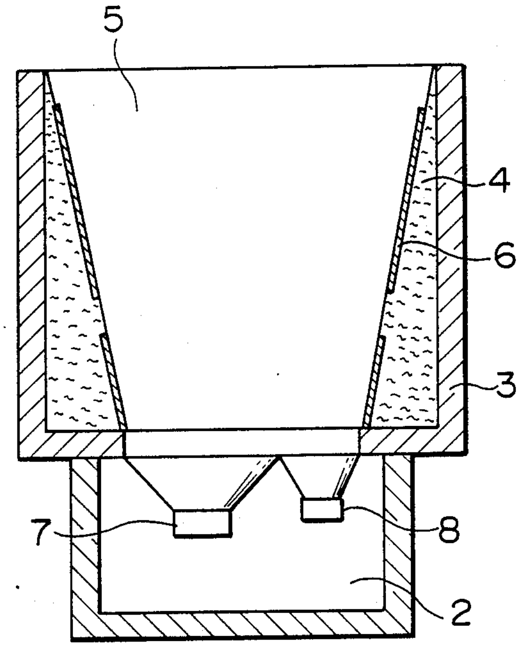
FIG. 7 is a sectional view of a fifth embodiment of the speaker system of the present invention.

FIG. 7 shows a fifth embodiment of the speaker system in accordance with the present invention. This embodiment has a high frequency sound speaker unit 7, a low frequency sound speaker 8, a back cavity 2, an acoustic pipe 3 for guiding the sound waves generated on the front surfaces of both speaker units 7 and 8, a partition member 6 disposed in the acoustic pipe 3 so as to define an acoustic path 5 and having slits one of which is located near the sound outlet opening of the acoustic pipe 3 while the other is in a region which is about ⅓ of the full length of the acoustic pipe as measured from the end surface of the diaphragm in the speaker unit, and a sound absorbing member 4 disposed in the space defined between the wall of the acoustic pipe 3 and the partition member 6.

The operation of the speaker system in accordance with the fifth embodiment is as follows. The sound waves emitted from the rear side of the high and frequency sound speaker units 7 and 8 are confined in the back cavity 2 so that it does not radiate outside. On the other hand, the sound waves from the front side of the diaphragm in the speaker units 7 and 8 are guided by the acoustic pipe 3 to reach the sound outlet opening so as to be radiated therefrom. A portion of the sound waves reaching the sound outlet opening is, however, reflected because the acoustic impedance is drastically changed at the sound outlet opening. The reflected wave tends to propagate backward towards the surface of the diaphragm. The reflected wave, however, is effectively absorbed by the sound absorbing member 4 in the acoustic pipe 3 so that no standing wave is generated in the acoustic pipe.

As explained before, the partition member 6 has slits in the region near the sound outlet opening and in the region which is ⅓ of the full length of the acoustic pipe 3 as measured from the surface of the speaker diaphragm, i.e., in the regions where the particle velocity is high. It is therefore possible to selectively suppress only the sound waves at frequencies at which standing waves are produced. The sound waves that are liable to be absorbed by sound absorbing material 4 can be guided to the sound outlet opening without being impeded by the sound absorbing member 4.

Figure 8:
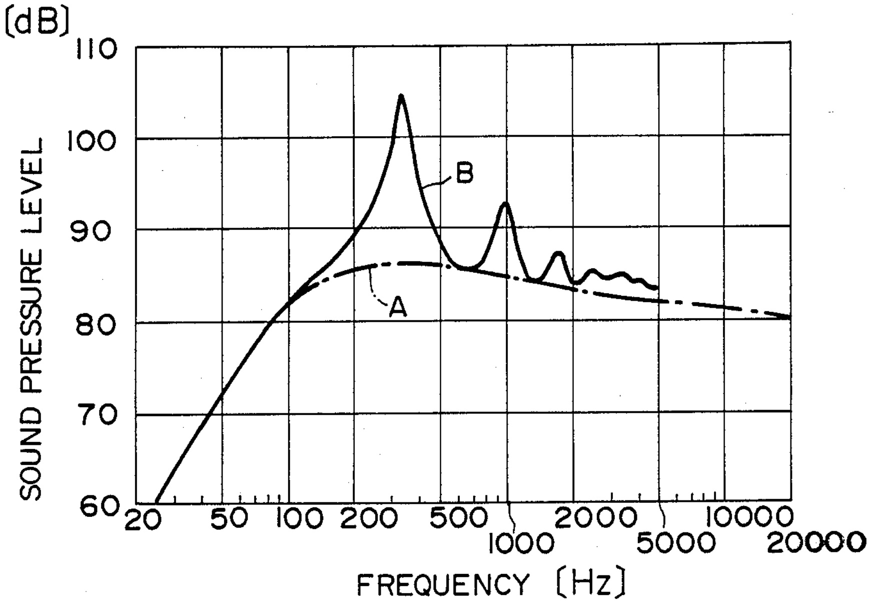
FIG. 8 illustrates a graph A showing the sound pressure frequency characteristics of a fifth embodiment and the sound pressure frequency characteristics of a known speaker system of the invention and a graph B illustrating the sound pressure frequency characteristics of a known speaker system.
Figure 9:
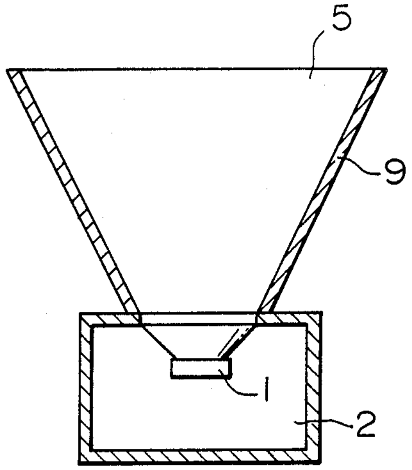
FIG. 9 (PRIOR ART)
FIG. 9 is a sectional view of a known speaker system.
Figure 10:
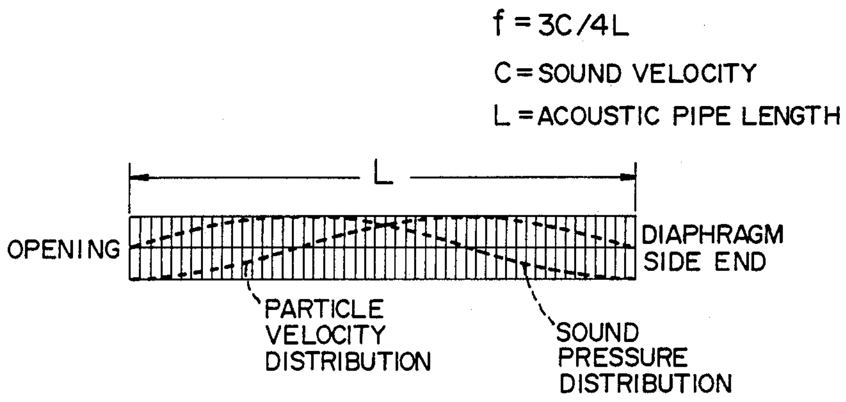
FIG. 10 is an illustration of particle velocity distribution and sound pressure distribution in a longitudinal section of the acoustic pipe.

FIG. 8 illustrates the reproduction sound pressure frequency characteristics exhibited by a speaker system with the horn or acoustic pipe in accordance with the fifth embodiment, in comparison with the characteristics exhibited by the conventional arrangement. From this figure, it will be understood that the conventional speaker system exhibits characteristics B which includes peaks and troughs due to existence of a standing wave, while the speaker system of the fifth embodiment exhibits flat reproduction sound pressure frequency characteristics A up to high pitch region of the tone.

Thus, the fifth embodiment also provides relatively flat sound pressure frequency characteristics, by suppressing the peaks of sound pressure which are inevitably high in the known horn or acoustic pipe due to the presence of a standing wave.

Obviously, the advantages offered by the fifth embodiment can equally be enjoyed even when the acoustic path 5 is modified as illustrated in FIGS. 3(*a*) to 3(*c*).

What is claimed is:

1. A speaker system, comprising at least one diaphragm having front and rear surfaces; an acoustic path for guiding sound waves generated on said front surface of said diaphram; a sound absorbing member having an inner surface defining said acoustic path; and a partition member disposed on said inner surface of said sound absorbing member to surround a portion of said acoustic path, whereby said partition member is disposed such that said sound absorbing member is exposed to said acoustic path at at least one part of said sound absorbing member, said at least one part being located at any position of said sound absorbing member except at a region thereof just adjacent said diaphragm.

2. A speaker system according to claim 1, wherein said partition member extends from the front surface of said diaphragm to a position which is spaced from said front surface of said diaphragm by about ⅓ of the full length of said acoustic path.

3. A speaker system according to claim 1, wherein the position where said sound absorbing member is exposed is in a region where a standing wave has a high particle velocity distribution.

4. A speaker system according to claim 3 wherein said sound absorbing member is exposed in a region which is spaced from the front surface of said diaphram by about ⅓ of the full length of said acoustic path and a region which is near the sound outlet opening of said acoustic path.

5. A speaker system according to claim 1, wherein the cross-sectional area of said acoustic path is progressively increased from one end near said diaphragm towards another end near said sound outlet opening.

6. A speaker system according to claim 5, further including an acoustic pipe having a wall surrounding said sound absorbing member, wherein said acoustic path is defined by said sound absorbing member and the wall of said acoustic pipe.

7. A speaker system according to claim 1, wherein said acoustic path has a constant cross-sectional area over the entire length thereof.

8. A speaker system according to claim 7, wherein said acoustic path is defined by the wall of said sound absorbing member and the wall of an acoustic pipe.

9. A speaker system according to claim 7, further including an acoustic pipe having a wall surrounding said sound absorbing member, whereby said acoustic path is defined by said sound absorbing member and said wall of said acoustic pipe.

10. A speaker system according to claim 1, further comprising a plurality of diaphragms having front and rear surfaces, said plurality of diaphragms including said at least one diaphragm, and wherein said acoustic path is provided commonly on the front side of said plurality of diaphragms.

11. A speaker system according to claim 1, wherein said sound absorbing member is provided in an acoustic pipe.

12. A speaker system according to claim 1, wherein the amount of the material of said sound absorbing member is progressively decreased from one end near said diaphram towards another end near said sound outlet opening.

13. A speaker system according to claim 1, wherein the flow resistance per unit area of said sound absorbing member is progressively decresed from one end near said diaphragm towards another end near said sound outlet opening.

* * * * *